United States Patent
Iovdalsky et al.

(10) Patent No.: US 6,294,827 B1
(45) Date of Patent: Sep. 25, 2001

(54) HYBRID MICROWAVE-FREQUENCY INTEGRATED CIRCUIT

(75) Inventors: Viktor Anatolievich Iovdalsky; Eduard Volfovich Aizenberg; Vladimir Iliich Beil; Mikhail Ivanovich Lopin, all of Fryazino (RU)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/077,616

(22) PCT Filed: Sep. 26, 1996

(86) PCT No.: PCT/RU96/00277

§ 371 Date: May 26, 1998

§ 102(e) Date: May 26, 1998

(87) PCT Pub. No.: WO98/13875

PCT Pub. Date: Apr. 2, 1998

(51) Int. Cl.[7] .......................... H01L 29/40; H01L 23/02; H01L 23/34

(52) U.S. Cl. .......................... 257/678; 257/728; 257/724; 257/664

(58) Field of Search ................................ 257/678, 664, 257/728, 724

(56) References Cited

U.S. PATENT DOCUMENTS

| | | | | |
|---|---|---|---|---|
| 4,150,393 | * | 4/1979 | Wilson et al. | 257/700 |
| 4,868,613 | * | 9/1989 | Hirachi | 257/527 |
| 5,063,177 | * | 11/1991 | Geller et al. | 257/528 |
| 5,162,258 | * | 11/1992 | Lemnios et al. | 257/528 |
| 5,219,827 | * | 6/1993 | Higaki et al. | 333/219 |
| 5,313,175 | * | 5/1994 | Bahl et al. | 333/116 |
| 5,726,468 | * | 3/1998 | Oku et al. | 257/197 |
| 5,898,200 | * | 4/1999 | Sugiyama et al. | 257/330 |
| 5,929,729 | * | 7/1999 | Swarup | 333/246 |

* cited by examiner

Primary Examiner—Mahshid Saadat
Assistant Examiner—Jhihan B. Clark
(74) Attorney, Agent, or Firm—Piper Marbury Rudnick & Wolfe

(57) ABSTRACT

In a microwave hybrid integrated circuit a metallized recess (8) is formed on the back or face side of a board (1) of the metallization of which recess serves as a bottom plate (6) of a capacitor (5), a remaining portion (9) of the board (1) under the recess (8) serves as the dielectric of the capacitor (5), and a top plate (7) thereof is situated on the face side of the board (1) and makes part of a topological metallization pattern (2), the remaining portion of the thickness of the board (1) in the recess (8) being of 1 to 400 μm.

8 Claims, 3 Drawing Sheets

HYBRID MICROWAVE-FREQUENCY INTEGRATED CIRCUIT

FIELD OF THE INVENTION

The present invention relates in general to electronic engineering and more specifically to a microwave hybrid integrated circuit (IC).

BACKGROUND OF THE INVENTION

A microwave hybrid integrated circuit is known, the circuit comprises a dielectric board having a topological metallization pattern on its face side and a shield grounding metallization on the back side thereof. The board has a metallized hole electrically connecting a bonding pad that makes part of the topological metallization pattern, to the shield grounding metallization. A capacitor is secured with its bottom plate on the bonding pad, while its top plate electrically connects the capacitor to other circuit components through a wire lead. The board is electrically connected with its back size to a metal grounded base (Hyper World, September 1990, numero 2. Thompson composents microondes. 20th European microwave conference. 90 the international conference and exhibition designed for the microwave community, conference proceedings, Volume 1. Duna international hotel, Budapest, Hungary, September 10–13 published by Microwave Exhibitions Publishers Ltd.).

The aforecited microwave hybrid integrated circuit is possessed of low electrical characteristics caused by a relatively high spurious inductance of the metallized grounding hole, as well as by low weight-size parameters associated with a large height of the circuit.

Another microwave hybrid integrated circuit is known, the circuit comprises a dielectric board having a hole and provided with a topological metallization pattern on its face side and a shield grounding metallization on the back side which is electrically connected to a metal base, a capacitor placed in the board hole and secured with its bottom plate on the metal grounded base, while the capacitor top plate is electrically connected, through a wire lead, to the topological metallization pattern (cf. Microwaves and RF, 1986, vol.9, p.232).

The aforementioned microwave hybrid integrated circuit is possessed of low electrical characteristics resultant from a high spurious inductance of the connection of the top capacitor plate to the topological metallization pattern, as well as low weight-size parameters associated with large linear dimensions due to long distances between the top capacitor plate and the topological metallization pattern.

SUMMARY OF THE INVENTION

The principal object of the present invention is to provide a microwave hybrid integrated circuit having such a constructive arrangement that would provide to enhance electrical and weight-size characteristics of the circuit.

The foregoing object is accomplished due to the fact that in a microwave hybrid IC, comprising a dielectricn insulating board provided with a topological metallization pattern on its face side and with a shield grounding metallization on its back side, said metallization being electrically connected to a metal base, a capacitor electrically connected by its first plate to the base, and by its second plate to the topological metallization pattern, according to the invention, a metallized recess is formed on the back or face side of the board, the metallization of which recess serves as the first capacitor plate, the board portion above or below the recess serves as the capacitor dielectric, while the second plate is located on the face side of the board and makes a part of the topological metallization pattern, the remaining board thickness in the recess being equal to 1–400 μm.

A metallized counter recess may be formed on the face side of the board above the recess in the back side thereof, the metallization of said hole serving as the second capacitor plate and being electrically connected to the topological metallization pattern.

On the metal base a projection may be formed being placed in the board recess and electrically connected to the metallization of the recess, the spacing between the side walls of the recess and the side walls of the projection being of 0.001 to 5.0 mm.

The recess in the board is expedient to be filled with an electrically conducting material.

The topological metallization pattern may comprise the capacitor trimming elements electrically connected to the capacitor plate.

Forming the metallized recess in the back board surface and using the recess metallization as the bottom capacitor plate and the rest of the board thickness in the recess as the capacitor dielectric, as well as establishing the second (top) capacitor plate as a part of the topological metallization pattern on the face board surface allow to form the capacitor within the board volume, thus improving the weight-size characteristics of the circuit.

Restricting the remainder board thickness from below is defiled by the board strength, and from above it is defined by a minimum capacity and maximum area of the capacitor that can be used in the circuit so as to improve the weight-size characteristics thereof.

Forming the projection on the metal base, its locataion in the recess on the board back side, and the electrical connection of the recess metallization to the projection results in a reduced spurious inductance of the grounding and hence improves the electrical characteristics of the circuit.

Restricting the spacing between the projection and the recess walls from below is defined by the possibility to displace the projection towards either of the recess walls, and from above it is defined to ensure an adequate strength of the recess bottom.

Forming the metallized counter recess on the face board side above the recess in the back board surface enhance the manufacturability of the circuit.

Forming the recess in the face board surface and filling said recess with an electrically conducting material allows of establishing an electric connection between the capacitor plate and the topological metallization pattern having the low spurious inductance, thus enhancing the electrical parameters of the circuit.

Providing the capacitor trimming elements in the topological metallization pattern, which elements are electrically connected to the top capacitor plate and situated above the recess in the board, enables more accurate capacity values of the capacitor, thereby enhancing the electrical parameters of the circuit.

BRIEF DESCRIPTION OF THE DRAWINGS

The present invention is further illustrated by a detailed description of a specific exemplary embodiments thereof to be taken with reference to the accompanying drawings, wherein.

BEST METHODS OF CARRYING OUT THE INVENTION

The microwave hybrid integrated circuit, according to the invention, comprises a dielectric board 1 made of, e.g., Polycor and provided with a topological metallization pattern 2 on the face side thereof and with a shield grounding metallization 3 on its back side, the composition of the metallization being, e.g., as follows: Ti(100 Ohm/sq.mm)— Pd (0.2 $\mu$m)—Au (3 $\mu$m). The board 1 is joined, e.g. soldered, with a metal grounding base 4.

Figure 2:
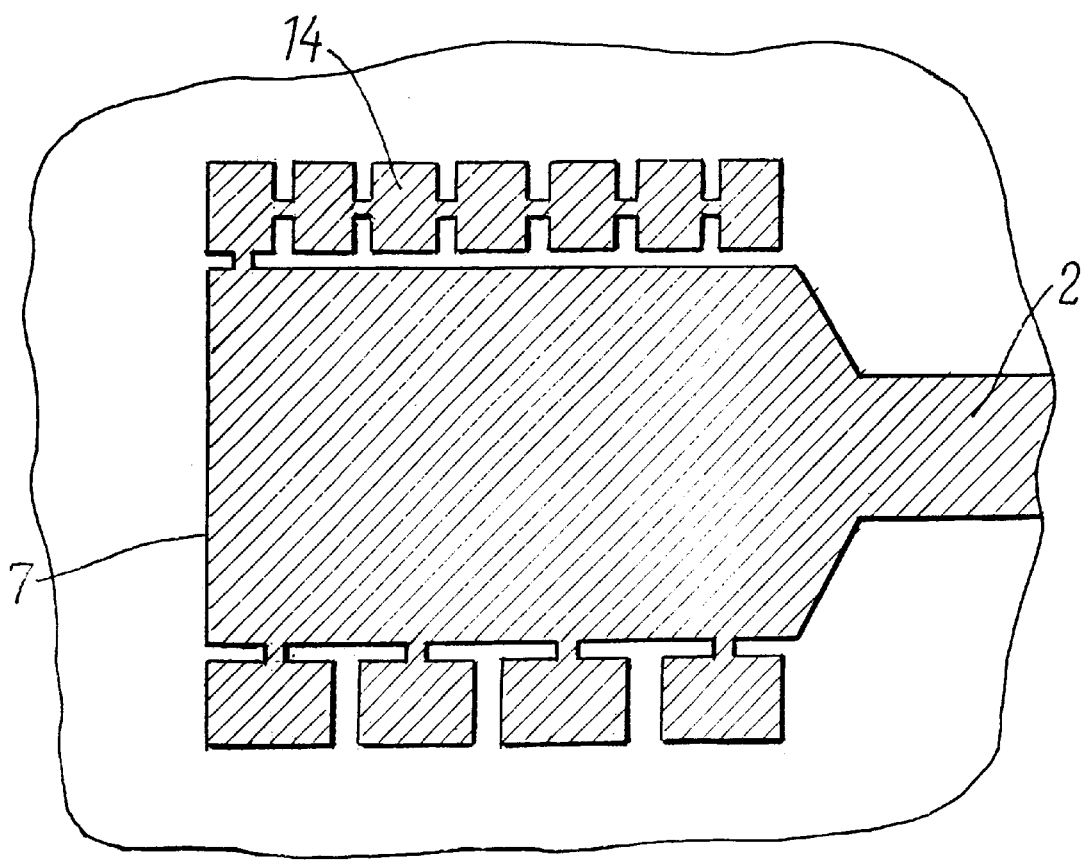
FIG. 2 is a plan view of FIG. 1.

A capacitor 5 is secured with its first (bottom) plate 6 on the metal base 4. The second (top) plate 7 (FIG. 2) of the capacitor 5 is electrically connected to the topological metallization pattern 2.

Figure 1:
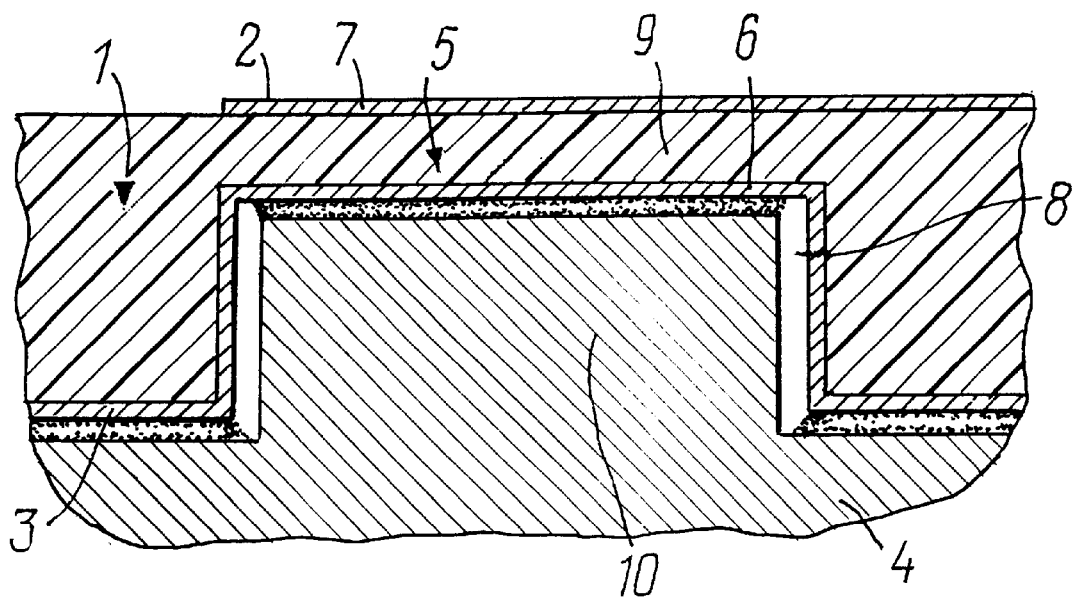
FIG. 1 is a sectional view of the filed microwave hybrid integrated circuit.

On the back side of the board 1 (FIG. 1) a metallized recess 8 is provided, having the metallization structure, e.g., as follows: Pd—Ni (0.12 $\mu$m)—Au (2 $\mu$m). The metallization of the recess 8 serves as the first (bottom) plate 6 of the capacitor 5. A remainder portion 9 of the board 1 above the recess 8 serves as the dielectric of the capacitor 5 separating the plates 6 and 7 thereof. The second (top) plate 7 is situated on the face side of the board 1 and makes part of the topological metallization pattern 2. The remaining thickness of the board 1 in the recess 8 equal, e.g., 70 mu.

On the metal base 4 a projection 10 is formed, being placed in the recess 8 of the board 1 and electrically connected to the metallization of the recess 8. The spacing between the side walls of the recess 8 and the side walls of the projection 10 is 0.2 mm (that is, while the projection is 1.0×1.0 mm, the recess 8 is 1.4×1.4 mm).

Figure 3:
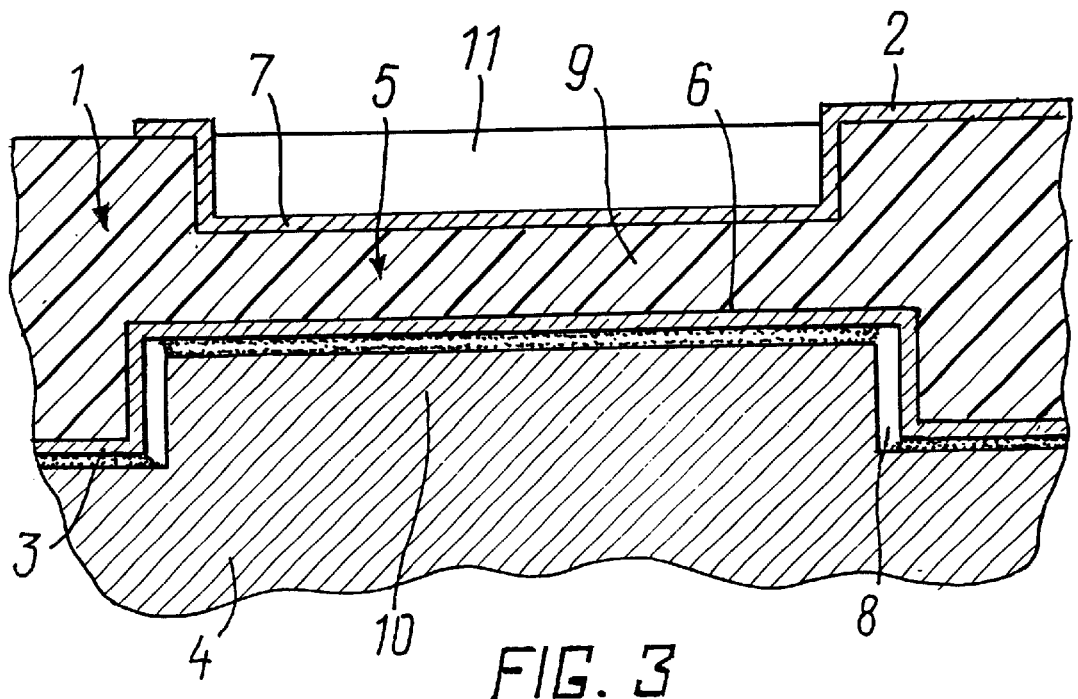
FIG. 3 is a sectional view of another embodiment of the filed microwave hybrid integrated circuit.

A metallized counter recess 11 is formed on the face side of the board 1 (FIG. 3) above the recess 8 on the back side of the board 1. The metallization of the recess 11 serves as the top plate 7 of the capacitor 5 and is electrically connected to the topological metallization pattern 2.

Figure 4:
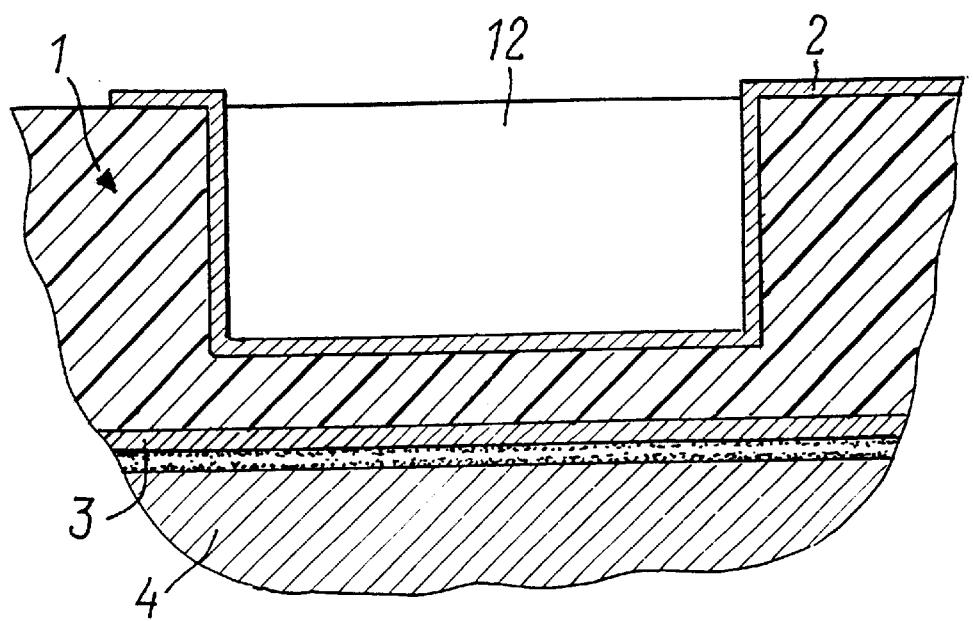
FIG. 4 is a sectional view of one more embodiment of the filed microwave hybrid integrated circuit.

A metallized recess 12 (FIG. 4) may be made only on the face side of the board 1.

Figure 5:
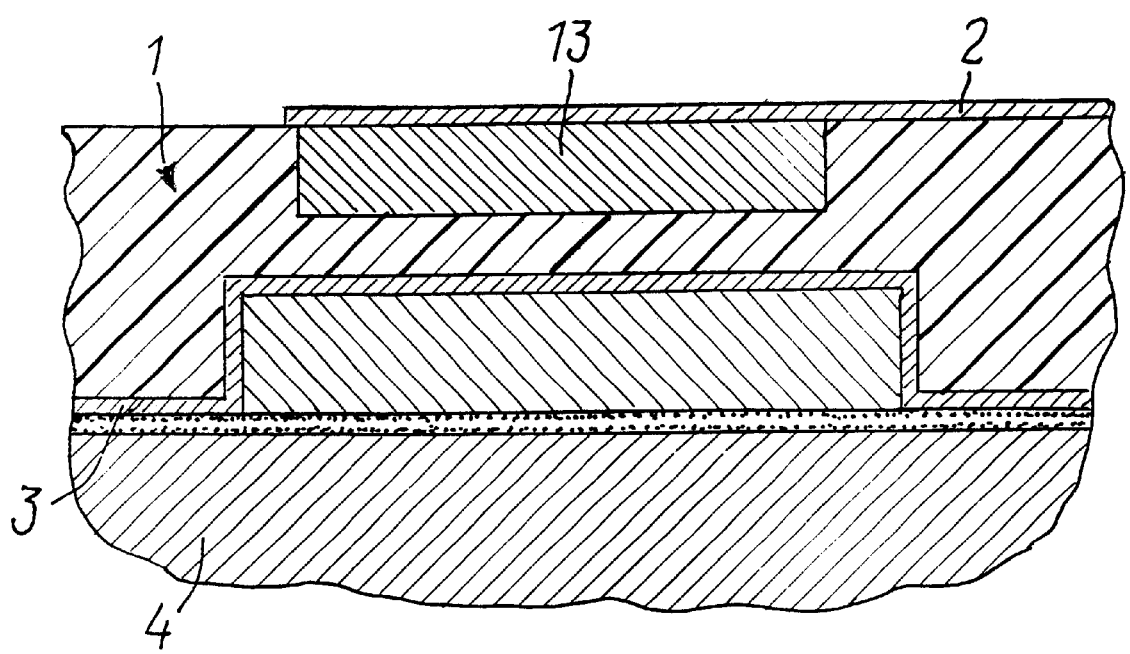
FIG. 5 is a sectional view of still one more embodiment of the filed microwave hybrid integrated circuit.

The recesses 8, 11, and 12 in the board 1 may be filled with an electrically conducting material 13 (FIG. 5).

Elements 14 (FIG. 2) for trimming the capacitor 5 may be formed in the topological metallization pattern 2, said elements being electrically connected to the top capacitor plate and being located above the recess 8.

The microwave hybrid integrated circuit, according to the invention, functions as follows.

A signal is applied to the top plate 7 (FIG. 1) of the capacitor 5 and a charge arising on the bottom plate 6 thereof is grounded through the projection 10 of the metal base 4, or directly through the metal grounding base 4.

Using the filed integrated circuit allows to enhance the electrical characteristics due to reduced spurious inductance of the electrical connection between the capacitor and the topological metallization pattern, and to improve the weight-size characteristics due to building the capacitors into the board itself Additionally, the integrated circuit, according to the invention, allows to enhance the relyability of the circuit due to a reduced number of joints and to reduce the consumption of precious metals.

In describing the disclosed embodiment of the present invention, specific narrow terminology is used for the sake of clarity. However, the invention is not restricted to the specific terms so selected, and it should be understood that each such term covers all equivalent elements functioning in a similar way and used for solving similar problems.

Although the present invention has been described herein with reference to the preferred embodiment, it will be understood that various modifications and alterations may occur to the details of construction without departing from the spirit and scope of the invention, as will be readily understood by those skilled in the art.

All these modifications and alterations should be considered to remain within the limits of the spirit and scope of the invention and the claims that follow.

Industrial Applicability

The present invention can be used in semiconductor microelectronics.

We claim:

1. A microwave hybrid integrated circuit, comprising a dielectric board (1) provided with a topological metallization pattern (2) on the face side thereof and with a shield grounding metallization (3) on its back side, said metallization being electrically connected to a metal base (4), a capacitor (5) electrically connected by its first plate (6) to the base (4), and by its second plate (7) to the topological metallization pattern (2), CHARACTERIZED in that a metallized recess (8) is formed on the face side of the board (1), the metallization of which recess serves as the first plate (6) of the capacitor (5), a remaining portion (9) of the board (1) above or below the recess (8) serves as the dielectric of the capacitor (5), while the second plate (7) thereof is located on the face side of the board (1) and makes a part of the topological metallization pattern (2), the remaining board thickness in the recess (8) being equal to 1–400 $\mu$m.

2. The microwave hybrid integrated circuit as set forth in claim 1, wherein metallized counter recess (11) is formed on the face side of the board (1) above the recess (8) in the back side of the board (1), the metallization of said hole serving as the second plate (7) of the capacitor (5) and being electrically connected to the topological metallization pattern 2.

3. The microwave hybrid integrated circuit as set forth in claim 1, wherein a projection (10) is formed on the metal base (4), said projection being placed in the recess (8) of the board (1) and being electrically connected to the metallization of the recess (8), the spacing between the side walls of the recess (8) and the side walls of the projection (10) being of 0.001 to 5.0 mm.

4. The microwave hybrid integrated circuit as set forth in claim 1 or claim 2, CHARACTERIZED in that the recess in the board is filled with an electrically conducting material (13).

5. The microwave hybrid integrated circuit as set forth in claim 1 or claim 2, CHARACTERIZED in that the topological metallization pattern (2) above the recess (8) comprises elements (14) for trimming the capacitor (5), said elements being electrically connected to the plate (7) of the capacitor (5).

6. The microwave hybrid integrated circuit as set forth in claim 3, CHARACTERIZED in that the recess in the board is filled with an electrically conducting material (13).

7. The microwave hybrid integrated circuit as set forth in claim 3, CHARACTERIZED in that the topological metallization pattern (2) above the recess (8) comprises elements (14) for trimming the capacitor (5), said elements being electrically connected to the plate (7) of the capacitor (5).

8. The microwave hybrid integrated circuit as set forth in claim 4 or claim 5, CHARACTERIZED in that the topological metallization pattern (2) above the recess (8) comprises elements (14) for trimming the capacitor (5), said elements being electrically connected to the plate (7) of the capacitor (5).

* * * * *